United States Patent
Saito et al.

(10) Patent No.: US 6,650,756 B1
(45) Date of Patent: Nov. 18, 2003

(54) METHOD AND APPARATUS FOR CHARACTERIZING AUDIO TRANSMITTING SYSTEM, AND METHOD AND APPARATUS FOR SETTING CHARACTERISTICS OF AUDIO FILTER

(75) Inventors: Nozomu Saito, Iwaki (JP); Tomohiko Ise, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 0 days.

(21) Appl. No.: 09/082,566

(22) Filed: May 21, 1998

(30) Foreign Application Priority Data

May 21, 1997 (JP) .............................. 9-147292

(51) Int. Cl.[7] .......................... A61F 11/06; G10K 11/16; H03B 29/00
(52) U.S. Cl. ................. 381/71.12; 381/71.11; 381/71.4; 708/322
(58) Field of Search .............. 381/71.1, 71.2, 381/71.5, 71.7, 71.8, 71.9, 71.11, 71.12, 71.14, FOR 123; 708/322; 370/290; 379/406.08

(56) References Cited

U.S. PATENT DOCUMENTS

| | | | |
|---|---|---|---|
| 5,615,270 A | 3/1997 | Miller et al. ................. 381/57 |
| 5,638,304 A * | 6/1997 | Billoud ................... 381/71.11 |
| 5,668,747 A * | 9/1997 | Ohashi .................... 381/71.11 |
| 5,991,418 A * | 11/1999 | Kuo ........................ 381/71.11 |
| 6,330,336 B1 * | 12/2001 | Kasama ................... 381/71.11 |

* cited by examiner

*Primary Examiner*—Xu Mei
(74) *Attorney, Agent, or Firm*—Brinks Hofer Gilson & Lione

(57) ABSTRACT

A designing system for adaptively characterizing an audio transmitting system has a white noise generating unit for generating a white noise signal. A speaker radiates the white noise generated by the white noise generating unit into an acoustic space. A microphone is placed at a predetermined position in the acoustic space and collects sound radiated from the speaker. A FIR adaptive filter receives the above white noise signal. An LMS algorithm processing unit updates each tap coefficient of the adaptive filter by using the LMS algorithm. A computation unit calculates the difference between a detection signal output from the microphone and an output of the adaptive filter and outputs the difference as an error signal $\epsilon$. By using a white noise signal having an average power of one, the range of the step size parameter of the LMS algorithm required for stably operating the adaptive filter is fixed. According to the method for characterizing the audio transmitting system and the method for setting an audio filter, the stable operation of the adaptive filters is ensured without increasing the complexity of the overall system.

21 Claims, 6 Drawing Sheets

METHOD AND APPARATUS FOR CHARACTERIZING AUDIO TRANSMITTING SYSTEM, AND METHOD AND APPARATUS FOR SETTING CHARACTERISTICS OF AUDIO FILTER

BACKGROUND OF THE INVENTION

1. Field of the Invention

The present invention relates to a method and an apparatus for characterizing an audio transmitting system and also to a method and an apparatus for setting the characteristics of an audio filter. More particularly, the invention relates to a method and an apparatus for characterizing an audio transmitting system and also to a method and an apparatus for setting the characteristics of an audio filter, both of which are required for an equalization system that simulates an ideal acoustic space in a vehicle cabin.

2. Description of the Related Art

Generally, the propagation characteristics of sound which is emitted from a speaker installed inside a vehicle and heard are very complicated. This is one of the major factors that deteriorate the reproduced sound of an audio system. In order to overcome the above drawback, an audio system which controls a sound field by using a digital filter has been proposed.

An audio system shown in FIG. 7 is formed of an audio source 100 having a radio tuner and a CD player, a control filter 102 for controlling the frequency characteristics of audio signals output from the audio source 100, and a speaker 104 for radiating audio output from the control filter 102 into a vehicle cabin. Meanwhile, a target-response setting unit 106, in which target response characteristic (impulse response) H is set, receives an audio signal from the audio source 100 and outputs the corresponding target response signal. As used hereinafter, in the specification, the uppercase C, H, W, X, and U each indicate a vector quantity, and the lowercase w, x, and u each represent a scalar quantity. A computation unit 108 calculates an error (difference) between a sound signal output from a microphone 110 installed at an audio-detecting position (listening position) of a vehicle acoustic space and the target response signal output from the target-response setting unit 106. Thus, a determination of the characteristics of the control filter 102 so as to minimize the error calculated by the computation unit 108 enables the simulation of an ideal acoustic space.

The characteristics of the control filter 102 incorporated in the above-described audio system are determined by the following two steps.

Step 1: Adaptive Characterization of Audio Transmitting System

In the system illustrated in FIG. 8, the characteristics of a finite impulse response (FIR) adaptive filter 112 are first determined so as to be comparable to a vehicle cabin acoustic system C, thereby characterizing the audio transmitting system. Generally, as the adaptive algorithm for determining the characteristics of the FIR adaptive filter 112, a least mean squares (LMS) algorithm is used. According to the LMS algorithm, a vector W of each tap coefficient of the adaptive filter 112 is updated each sampling time based on the following equation:

$$W(n+1)=W(n)+\mu_1 X(n)\epsilon(n) \qquad (1)$$

where W(n) indicates a vector of a tap coefficient with respect to a time n; and X(n) represents a vector of a reference signal input into the system shown in FIG. 8. The factors W(n) and X(n) are further expressed by the following equations:

$$W(n)=[W(n,0),w(n,1), \ldots ,w(n,L-1)]$$

$$X(n)=[x(n),x(n-1), \ldots ,x(n-L+1)]$$

where L indicates the number of taps of the adaptive filter 112. Moreover, in equation (1), $\mu_1$ indicates a step size parameter, and $\epsilon(n)$ designates an error signal. The error signal represents the difference between a detection signal d' output from the microphone and an output of the adaptive filter 112. The above-described updating operation is repeated until the factor $\epsilon(n)$ becomes equal to or smaller than a predetermined value.

Step 2: Adaptive Design of Control Filter

Subsequently, the system illustrated in FIG. 9 is constructed by using the characteristics of the audio transmitting system determined by the foregoing step 1. The characteristics of a FIR adaptive filter 114 are then determined. Design of the control filter shown in FIG. 7 is thus performed. Referring to FIG. 9, a filter 116 is formed by fixing each tap coefficient of the adaptive filter 112 determined by the foregoing step 1 and is provided with characteristics corresponding to the vehicle cabin acoustics. The target-response setting unit 106 illustrated in FIG. 9 is the same as the one used in the audio system shown in FIG. 7, and ideal target response characteristics are set in the target-response setting unit 106.

A filtered-x LMS algorithm is generally employed, as the adaptive algorithm that determines the characteristics of the adaptive filter 114. According to the filtered-x LMS algorithm, a vector W of each tap coefficient of the adaptive filter 114 is updated each sampling time based on the following equation:

$$W(n+1)=W(n)+\mu_2 U(n)e(n) \qquad (2)$$

where W(n) represents a vector of a tap coefficient with respect to a time n; $\mu_2$ indicates a step size parameter; and U(n) designates a vector of a reference signal output from the filter 116 with respect to a time n. U(n) is further expressed by the following equation:

$$U(n)=[u(n),u(n-1), \ldots ,u(n-L+1)]$$

where L indicates the number of taps of the adaptive filter 114. Moreover, e(n) indicates an error signal representing the difference between a detection signal d'(n) output from the microphone and a target response signal d(n) output from the target-response setting unit 106. The above-described updating operation is repeated until the factor e(n) is equal to or smaller than a predetermined value.

The control filter 102 shown in FIG. 7 is designed by fixing the individual tap coefficients of the adaptive filter 114 which are determined by the foregoing two steps.

In this manner, the systems illustrated in FIGS. 8 and 9 including the adaptive filters 112 and 114, respectively, are constructed, and the individual tap coefficients are set by using predetermined algorithms, thereby enabling the design of the control filter 102. It is necessary, however, that the adaptive filters 112 and 114 be constantly and stably operated in order to design the control filter 102 as described above.

For stably operating the adaptive filter 112 in the system illustrated in FIG. 8, the step size parameter $\mu_1$ contained in equation (1) should satisfy the condition indicated by the following expression:

$$0 < \mu_1 < (2/(LE[x(n)^2])) \qquad (3)$$

wherein L indicates the number of taps of the adaptive filter 112; E[ ] represents an expectation operator; and x(n) indicates a momentary value of the reference signal with respect to a time n.

Similarly, for stably operating the adaptive filter 114 in the system illustrated in FIG. 9, the step size parameter $\mu_2$ included in equation (2) should satisfy the condition represented by the following expression:

$$0 < \mu_2 < (2/LE[u(n)^2]) \qquad (4)$$

where L indicates the number of taps of the adaptive filter 114; and u(n) indicates a momentary value of the reference signal with respect to a time n.

In a typical audio system, such as the one shown in FIG. 7, it is vital that the control filter 102 be stably operated. Accordingly, the adaptive filters 112 and 114 used for designing the control filter 102 should be operated stably. Thus, the step size parameters $\mu_1$ and $\mu_2$ are required to satisfy the conditions represented by expressions (3) and (4). The factors $E[x(n)^2]$ and $E[u(n)^2]$ calculated by using expectation operators are contained in expressions (3) and (4), respectively. Thus, in order to reliably satisfy the above conditions (expressions (3) and (4)), the step size parameters $\mu_1$ and $\mu_2$ should be set by sequentially measuring the power of the reference signals x(n) and u(n). However, the addition of a structure required for measuring the power of the reference signals x(n) and u(n) increases the complexity of the systems illustrated in FIGS. 8 and 9, further causing an increase in the cost of the product.

SUMMARY OF THE INVENTION

Accordingly, in view of the above, it is an object of the present invention to provide a method for characterizing an audio transmitting system and a method for setting the characteristics of an audio filter, both of which ensure the stable operation of adaptive filters without increasing the complexity of the overall system.

In order to achieve this object, according to one aspect of the present 1invention, there is provided a method for characterizing an audio transmitting system. In this system, tap coefficients of an adaptive filter are set by using an LMS algorithm, in which case, a white noise signal is used as an input signal into the adaptive filter.

In this LMS algorithm, it is generally known that the step size parameter $\mu_1$ should satisfy the condition represented by expression $0 < \mu_1 < (2/(LE[x(n)^2]))$ in order to stably operate the adaptive filter, where L indicates the number of taps of the adaptive filter, E[ ] represents an expectation operator, and x(n) is an input signal into the adaptive filter at a time n.

In the present invention, a white noise signal having an average power of one is used as an input signal into the adaptive filter. Accordingly, the above expression can be modified into $0 < \mu_1 < (2/L)$, and the upper limit is fixed. This eliminates the need for setting the step size $\mu_1$ upon sequentially calculating the average power of the input signals into the adaptive filter. Moreover, a structure which would otherwise be required can be omitted. Additionally, by setting the step size parameter $\mu_1$ in a fixed range, the adaptive filter can be stably operated.

According to another aspect of the present invention, there is provided an apparatus for characterizing an audio transmitting system. The apparatus includes a signal generating unit for generating a predetermined signal. A speaker radiates the predetermined signal generated by the signal generating unit into an acoustic space. A microphone is placed at a predetermined position in the acoustic space and collects sound radiated from the speaker. An adaptive filter receives the predetermined signal output from the signal generating unit. A computation unit calculates the difference between an output signal of the microphone and an output signal of the adaptive filter and outputs the difference as an error signal. A first algorithm-processing unit receives the predetermined signal output from the signal generating unit and the error signal output from the computation unit and sets a tap coefficient of the adaptive filter by using a predetermined algorithm. Thus, the apparatus determines characteristics of the audio transmitting system according to characteristics of the adaptive filter.

According to still another aspect of the present invention, there is provided a vehicle-loaded audio system incorporating the foregoing apparatus for characterizing an audio transmitting system.

According to a further aspect of the present invention, there is provided a method for setting characteristics of an audio filter. In this method, tap coefficients of an adaptive filter are set by using the filtered-x LMS algorithm, in which case, a white noise signal is used as an input signal into the adaptive filter.

In this filtered-x LMS algorithm, it is generally known that the step size parameter $\mu_2$ should satisfy the condition represented by expression $0 < \mu_1 < (2/(LE[u(n)^2]))$ in order to stably operate the adaptive filter, where L indicates the number of taps of the adaptive filter, E[ ] represents an expectation operator, and u(n) represents a reference signal used in the filtered-x LMS algorithm at a time n.

In the present invention, a white noise signal having an average power of one is used as an input signal into the adaptive filter. Accordingly, the above expression can be modified into $0 < \mu_2 < (2/LC^t C))$ (C represents a characteristic vector indicating an impulse response of an acoustic space), and the upper limit is fixed. This eliminates the need for setting the step size $\mu_2$ upon sequentially calculating the average power of the reference signals used in the filtered-x LMS algorithm. Moreover, a structure which would otherwise be required can be omitted. Additionally, by setting the step size parameter $\mu_2$ in a fixed range, the adaptive filter can be stably operated.

According to a further aspect of the present invention, there is provided an apparatus for setting characteristics of an audio filter. The apparatus includes a signal generating unit for generating a predetermined signal. An adaptive filter receives the predetermined signal generated by the signal generating unit. A speaker radiates an output signal of the adaptive filter into an acoustic space. A microphone is placed at a predetermined position in the acoustic space and collects sound radiated from the speaker. A target-response setting unit, in which predetermined target response characteristics are set, outputs a target response signal corresponding to the predetermined signal input into the target-response setting unit. A computation unit calculates the difference between an output signal of the microphone and the target response signal output from the target-response setting unit and outputs the difference as an error signal. A second algorithm-processing unit receives the predetermined signal output from the signal generating unit and the error signal output from the computation unit and sets a tap coefficient of the adaptive filter by using a predetermined algorithm. Thus, the apparatus sets characteristics of the audio filter according to characteristics of the adaptive filter.

According to a yet further aspect of the present invention, there is provided a vehicle-loaded audio system incorporating the foregoing apparatus for setting the characteristics of an audio filter.

DESCRIPTION OF THE PREFERRED EMBODIMENT

In a vehicle-loaded audio system formed by application of the present invention, a white noise signal having an average power of one is used as an input signal in determining the characteristics of a control filter incorporated in this system by using an adaptive filter. A description is given below with reference to the drawings of a designing system for determining the characteristics of a control filter incorporated in an audio system according to an embodiment of the present invention.

Figure 7:
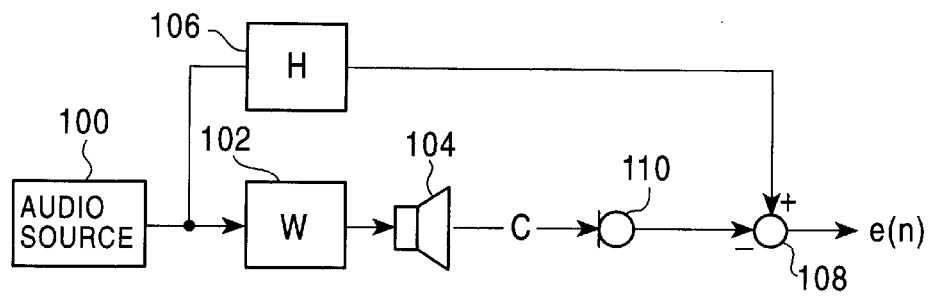
FIG. 7 is a schematic diagram illustrating a typical audio system including an adaptive filter.
Figure 8:
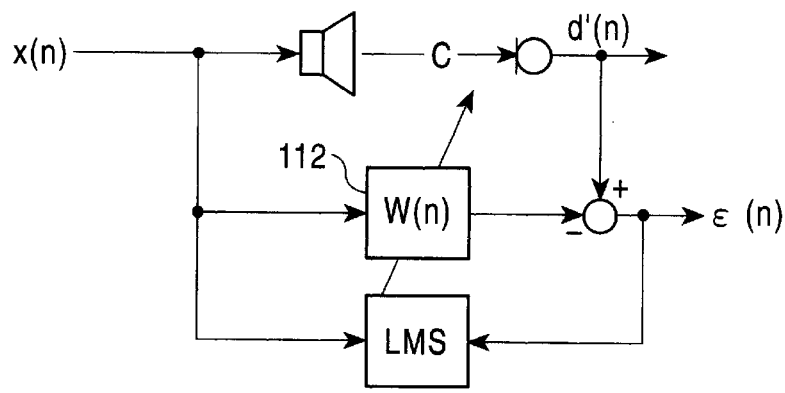
FIG. 8 is a schematic diagram illustrating the configuration of a conventional designing system required for adaptively characterizing an audio transmitting system.
Figure 9:
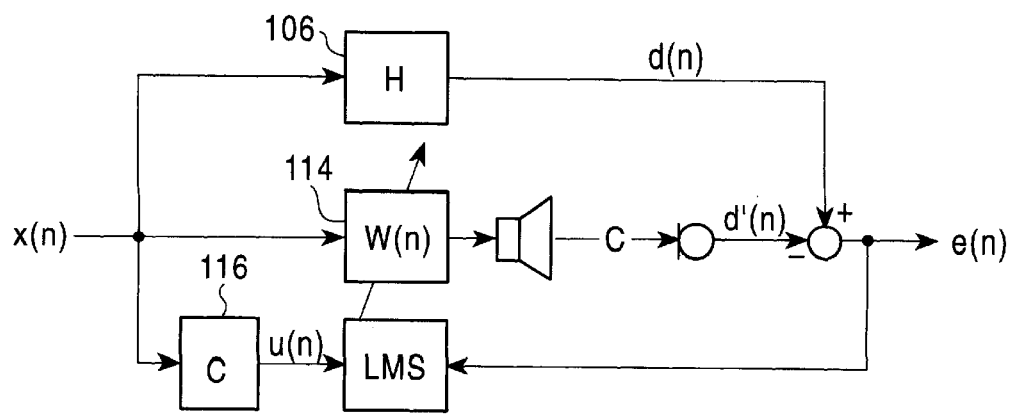
FIG. 9 is a schematic diagram illustrating the configuration of a known designing system required for adaptively designing a control filter.

The configuration of an audio system including a control filter to be designed in this embodiment is similar to that of the system shown in FIG. 7. The control filter 102 illustrated in FIG. 7 is a FIR digital filter having fixed tap coefficients, and the tap coefficients are determined in step 1 (described below) using an LMS algorithm and step 2 (described below) using a filtered-x LMS algorithm.

Figure 1:
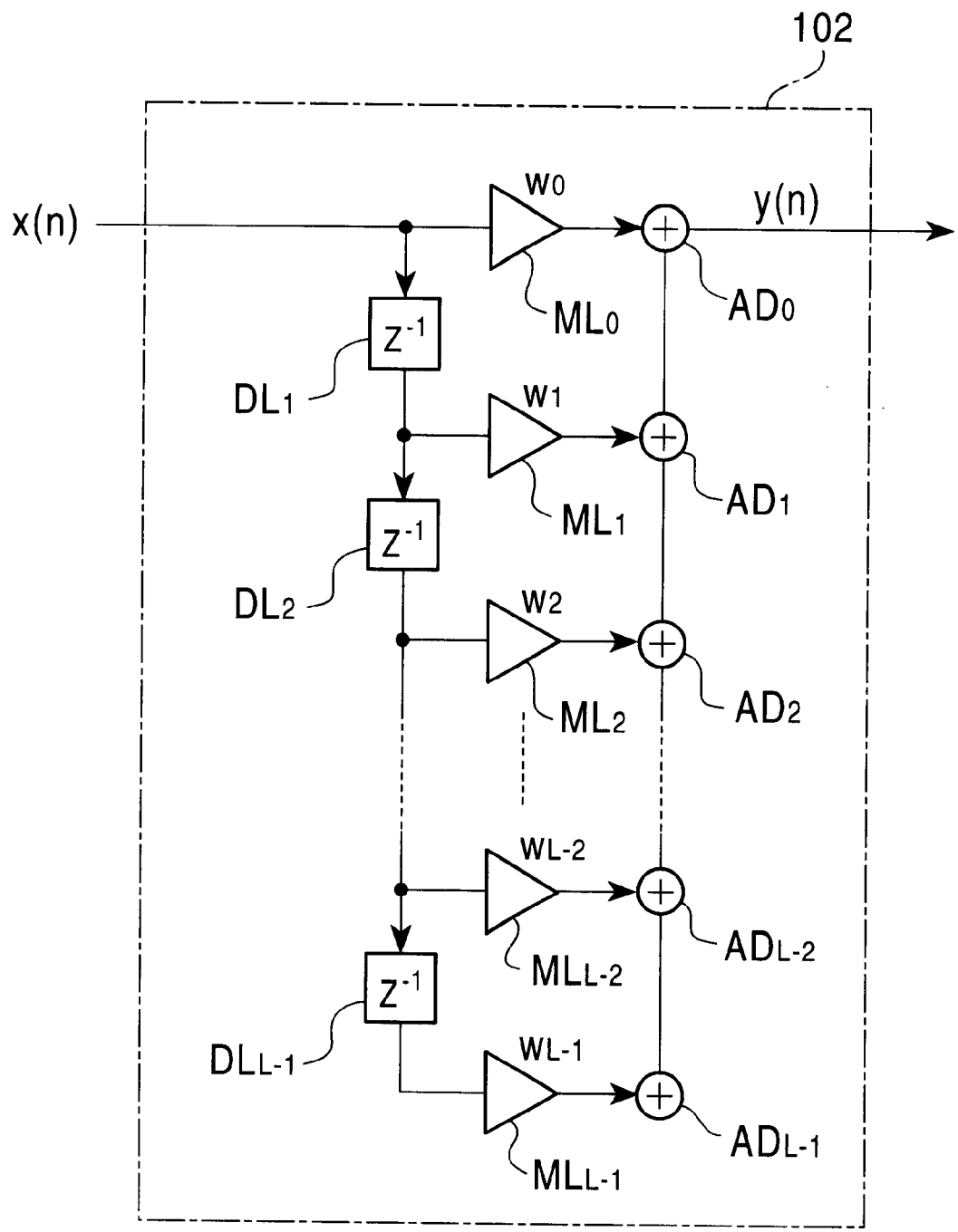
FIG. 1 is a schematic diagram illustrating the configuration of a FIR control filter.

FIG. 1 is a schematic diagram illustrating the configuration of a FIR control filter 102. The control filter 102, which has L number of taps, as illustrated in FIG. 1, includes the following elements. A (L−1) number of delay devices $DL_1$ through $DL_{L-1}$ sequentially delay an input signal for each sampling time. An L number of multipliers $ML_0$ through $ML_{L-1}$ multiply the individual delayed outputs by tap coefficients $w_0$ through $W_{L-1}$, respectively. Adders $AD_0$ through $AD_{L-1}$ sequentially add the individual multiplied outputs. In this embodiment, the control filter 102 is designed by determining L number of tap coefficients $w_0$ through $W_{L-1}$ according to step 1 and step 2 described below.

A method for designing the control filter 102 constructed as described above is described below in detail. Basically, the designing method can be divided into step 1 of adaptively characterizing an audio transmitting system and step 2 of adaptively designing the control filter in accordance with the result of step 1, as is conventionally performed. The detailed descriptions of the respective steps of this method are as follows.

Step 1: Adaptive Characterization of Audio Transmitting System

Figure 2:
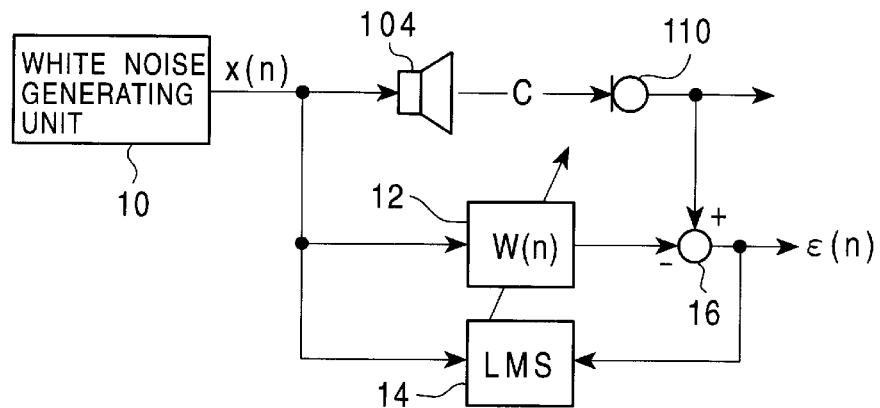
FIG. 2 is a schematic diagram illustrating the configuration of a designing system required for adaptively characterizing an audio transmitting system according to an embodiment of the present invention.

FIG. 2 is a schematic diagram illustrating the configuration of a designing system for adaptively characterizing an audio transmitting system. Referring to FIG. 2, the designing system includes not only a speaker 104 and a microphone 110, but also the following elements. A white noise generating unit 10 generates white noise signals having an average power of one. A FIR adaptive filter 12 receives white noise signals generated by the white noise generating unit 10. An LMS algorithm processing unit 14 updates the tap coefficients of the adaptive filter 12 by using the LMS algorithm as an adaptive algorithm. A computation unit 16 calculates the difference between a detection signal output from the microphone 110 and an output of the adaptive filter 12 and outputs the difference as an error signal $\epsilon$. The above-described LMS algorithm processing unit 14 corresponds to a first algorithm processing unit.

The speaker 104 and the microphone 110 should be of the types compatible with an audio transmitting system on which adaptive characterization is performed. Accordingly, in designing the control filter 102 used in the audio system shown in FIG. 7, the speaker 104 and the microphone 110 included in that audio system should be used. Moreover, it is necessary to position the speaker 104 and the microphone 110 as they are in the audio system illustrated in FIG. 7.

The vector of each tap coefficient W(n+1) of the adaptive filter 12 with respect to a time (n+1) can be calculated by the foregoing equation (1), where W(n) indicates the vector of each tap coefficient of the adaptive filter 12 with respect to a time n, X(n) represents the vector of a white noise signal input into the adaptive filter 12 from the white noise generating unit 10 at time n, $\epsilon$(n) indicates the error signal output from the computation unit 16 at time n, and $\mu_1$ designates the step size parameter.

In order to stably operate the adaptive filter 12, the step size parameter $\mu_1$ is required to satisfy the condition represented by the foregoing expression (3). In the designing system of this embodiment illustrated in FIG. 2, since a white noise signal having an average power of one generated by the white noise generating unit 10 is used as a reference signal to be input into the adaptive filter 12, $E[x(n)^2]$ contained in expression (3) results in unity. Accordingly, expression (3) can be simplified into the following expression:

$$0 < \mu_1 < (2/L) \qquad (5)$$

where the upper limit of the step size parameter $\mu_1$ (2/L) is a fixed value determined by the number of taps L of the adaptive filter 12.

As discussed above, the value of the step size parameter $\mu_1$ is set only once in such a manner that it satisfies expression (5). Then, the tap coefficients can be set while the adaptive filter 12 is constantly and stably operated. This eliminates the need for the provision of a structure for sequentially measuring the power of a reference signal to be input into the LMS algorithm processing unit 14, which is conventionally required for checking whether the adaptive filter 12 is being stably operated. As a consequence, an increase in the cost, which would otherwise be caused, can be prevented. Additionally, the burden imposed on the overall designing system shown in FIG. 2 is lessened over the known designing system provided with the above structure.

Step 2: Adaptive Designing of Control Filter

Subsequently, the control filter 102 illustrated in FIG. 7 is designed by using the characteristics of the audio transmitting system determined by the foregoing step 1. The control filter 102 corresponds to an audio filter in which characteristics are to be set in this embodiment.

Figure 3:
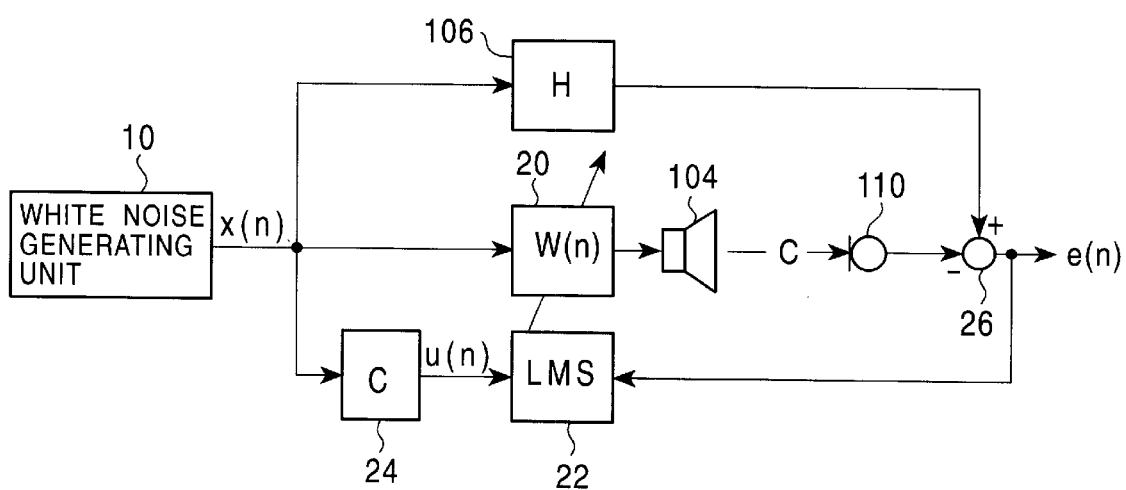
FIG. 3 is a schematic diagram illustrating the configuration of a designing system required for adaptively designing a control filter according to an embodiment of the present invention.

FIG. 3 is a schematic diagram illustrating the layout of a designing system used for adaptively designing the control filter 102. The designing system shown in FIG. 3 incorporates not only a speaker 104, a microphone 110, and a target-response setting unit 106 included in the audio system shown in FIG. 7, but also the following elements. A white noise generating unit 10 generates white noise signals having an average power of one. A FIR adaptive filter 20 receives white noise signals generated by the white noise generating unit 10. An LMS algorithm processing unit 22 and a filter 24 update the tap coefficients of the adaptive filter 20 by using the filtered-x LMS algorithm as an adaptive algorithm. A computation unit 26 calculates the difference between a detection signal output from the microphone 110 and a target response signal output from the target-response setting unit 106 and outputs the difference as an error signal $\epsilon$. The above-described filter 24 and the LMS algorithm processing unit 22 correspond to a second algorithm-processing unit.

The filter 24 is a FIR digital filter in which the fixed values of the tap coefficients of the adaptive filter 12 are set. The tap coefficients of the adaptive filter 12 have been obtained, as noted above, after repeatedly calculating the foregoing equation (1) until the error signal $\epsilon$ becomes equal to or smaller than a predetermined value in the designing system illustrated in FIG. 2. The filter 24 receives a white noise signal from the white noise generating unit 10 and outputs the corresponding value to the LMS algorithm processing unit 22 as a reference signal u.

The tap coefficient w(n+1) of the adaptive filter 20 with respect to a time (n+1) can be calculated by the foregoing equation (2), where w(n) indicates each tap coefficient of the adaptive filter 20 at a time n; u(n) represents a reference signal at a time n input into the LMS algorithm processing unit 22 from the filter 24; e(n) designates an error signal at a time n output from the computation unit 26; and $\mu_2$ indicates a step size parameter.

For stably operating the adaptive filter 20, the value of the step size parameter $\mu_2$ should satisfy the condition represented by the foregoing expression (4). In the designing system of this embodiment shown in FIG. 3, a white noise signal having an average power of one generated by the white noise generating unit 10 is input into the filter 24. Under this condition, the factor $E[u(n)^2]$ included in expression (4) can be modified into the following equation (6):

$$E[u(n)^2]=E[U(n)^tU(n)]=C^tE[X(n)X(n)^t]C \quad (6)$$

where X(n) represents a vector of a white noise signal having an average power of one generated by the white noise generating unit 10, C indicates the characteristic vector of an impulse response of the audio transmitting system (acoustic space) determined by the foregoing step 1, and the superscript $^t$ represents a transposed vector. The factors (X(n), C) are expressed by a column vector or a row vector having components corresponding to the number of taps L of the adaptive filter 20.

Since the factor X(n) indicates a vector of a white noise signal having an average power of one, $E[X(n)X(n)^t]$ is expressed by a unit matrix I. Thus, the foregoing equation (6) can be simplified into the following equation (7).

$$E[u(n)^2]=C^tIC=C^tC \quad (7)$$

Further, the equation (7) is substituted into expression (4), resulting in the following expression (8).

$$0<\mu_2<(2/(LC^tC)) \quad (8)$$

In expression (8), the factor $C^t C$ is known, and accordingly, it is required to be calculated only once before adaptive designing of the control filter in step 2 is started. Thus, the upper limit $(2/(LC^t C))$ of the step size parameter $\mu_2$ is a fixed value determined by the number of taps L of the adaptive filter 20.

In this manner, the step size parameter $\mu_2$ is set only once in such a manner that it satisfies the condition represented by expression (8). Then, the stable operation of the adaptive filter 20 is ensured. This eliminates the need to provide a structure for sequentially measuring the power of a reference signal required for processing the x-filtered LMS algorithm (a reference signal to be input into the LMS algorithm processing unit 22), which is conventionally needed for checking whether the adaptive filter 20 is being stably operated. Thus, an increase in the cost, which would otherwise be caused, can be prevented. Additionally, the burden imposed on the overall designing system illustrated in FIG. 3 is lessened over the known designing system provided with the above structure.

As described above, in this embodiment, in the two steps required for setting the tap coefficients of the control filter 102 used in an audio system (step 1 of adaptively characterizing an audio transmitting system and step 2 of adaptively designing a control filter), a white noise signal having an average power of one is used as an input signal to be input into each designing system. It is thus possible to fix the ranges within which the step size parameters $\mu_1$ and $\mu_2$ required for stably operating the adaptive filters 12 and 20, respectively, may fall. Hence, sequential measurements of the power of a reference signal in order to determine the ranges of the step size parameters $\mu_1$ and $\mu_2$ can be made unnecessary, which is conventionally needed for stably operating the adaptive filters 12 and 20. As a consequence, stable operation of the adaptive filters 12 and 20 is ensured without increasing the complexity of the respective designing systems.

The present invention is not restricted to the above embodiment, and various modifications and changes may be made without departing from the spirit and the scope of the present invention. For example, the foregoing embodiment has described the control filter required for performing equalization on all the frequency components of input audio signals. However, equalization may be performed on a specific frequency range (for example, low audio frequencies of 200 Hz or lower).

Figure 4:
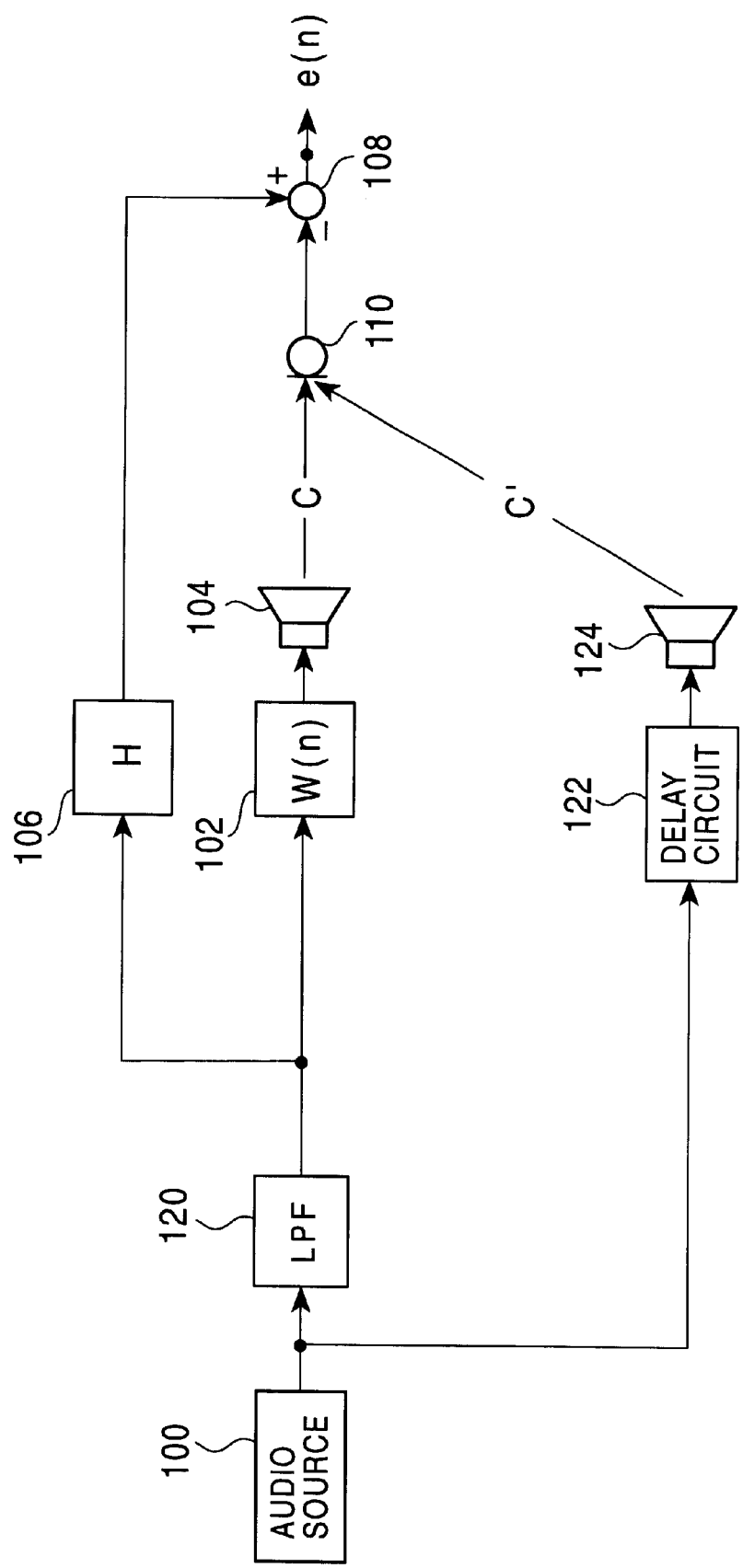
FIG. 4 is a schematic diagram illustrating the configuration of an audio system for performing equalization on low audio frequencies.

FIG. 4 is a schematic diagram illustrating the configuration of an audio system for conducting adaptation on only low audio frequencies. The audio system shown in FIG. 4 differs from the system illustrated in FIG. 7 in the following three points: 1) A low pass filter (LPF) 120 which passes only low audio frequencies is 10 inserted into the input side of the system, and an output of the LPF 120 is input into the target-response setting unit 106 and into the control filter 102; 2) an extra speaker 124 is provided for receiving audio signals in all the audible frequency ranges and for radiating the audio signals into a vehicle space; and 3) a delay circuit 122 for delaying audio signals is inserted into the stage prior to the speaker 124. By using the audio system constructed as described above, equalization is performed on only low audio frequency signals, thereby reducing the amount of calculations required.

Basically, the two steps employed in the foregoing embodiment may be used in setting the tap coefficients of the control filter 102 incorporated in the audio system illustrated in FIG. 4.

Figure 5:
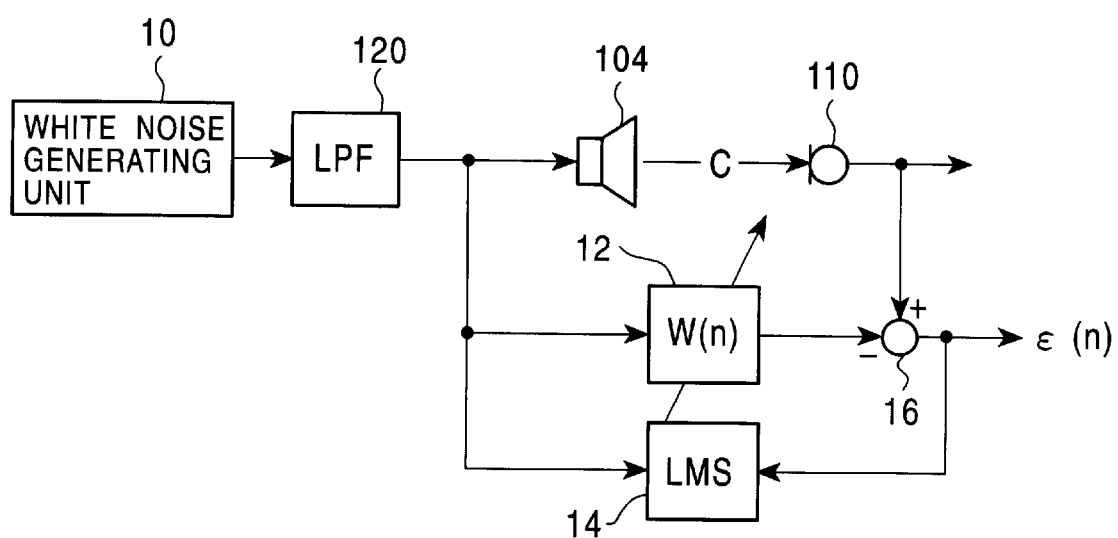
FIG. 5 is a schematic diagram illustrating an example of modifications made to a designing system required for adaptively characterizing an audio transmitting system.

More specifically, in order to adaptively characterize the audio transmitting system in step 1, the tap coefficients of the adaptive filter 12 are first determined by using the designing system illustrated in FIG. 5 (which is a modification of the system shown in FIG. 2 and only differs from it in the provision of the LPF 120). In determining the above tap coefficients, in order to stably operate the adaptive filter 12, the step size parameter pi used in the LMS algorithm is set in the range which satisfies the condition of the foregoing expression (5).

Figure 6:
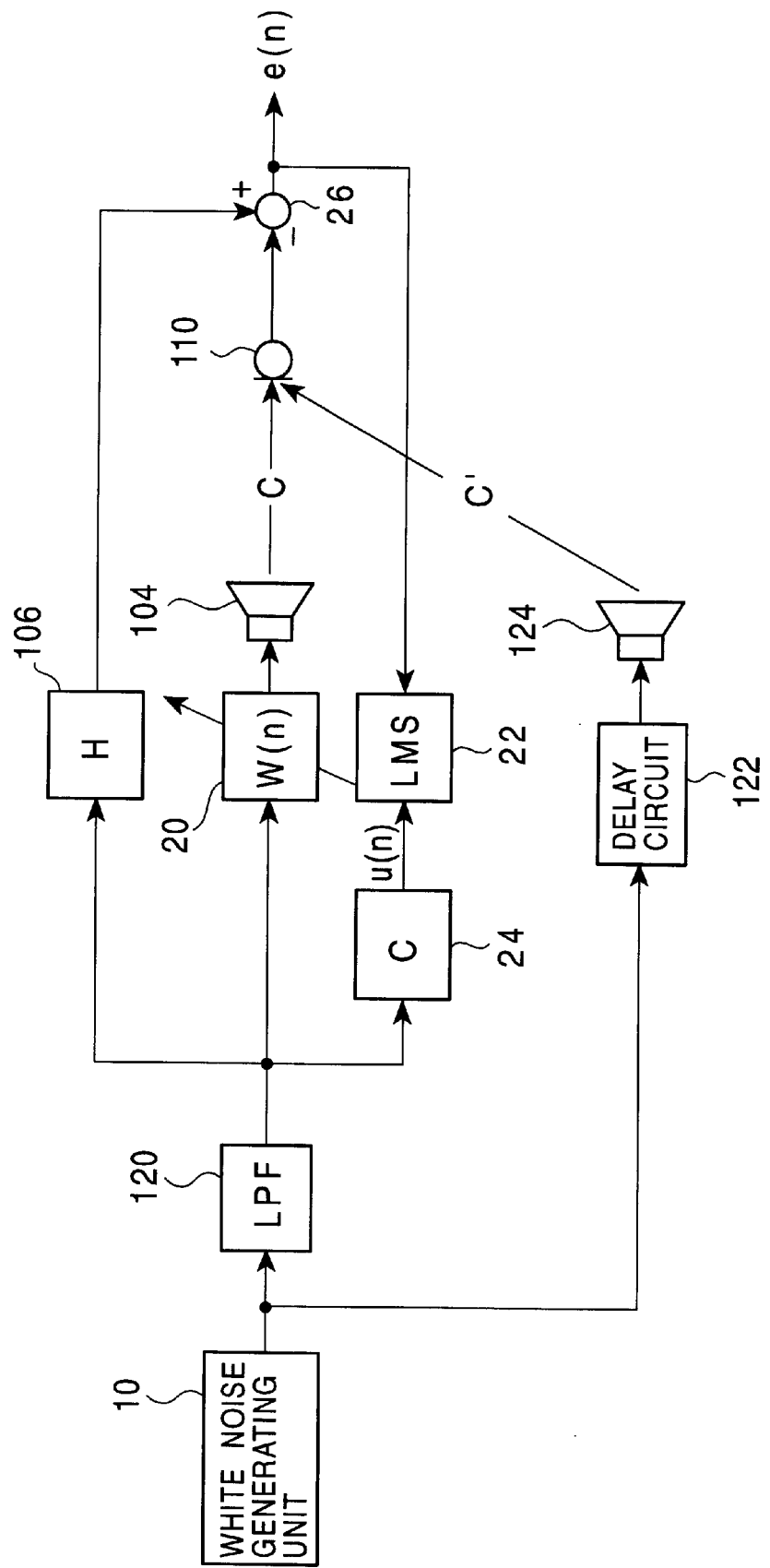
FIG. 6 is a schematic diagram illustrating an example of modifications made to a designing system required for adaptively designing a control filter.

Subsequently, for adaptively designing the control filter in step 2, the tap coefficients of the adaptive filter 20 are determined by using the designing system illustrated in FIG. 6 (which is a modification of the system shown in FIG. 3 and only differs from it in the provision of the LPF 120, the delay circuit 122, and the speaker 124). In determining the above tap coefficients, in order to stably operate the adaptive filter 20, the step size parameter $\mu_2$ used in the filtered-x LMS algorithm is set in the range which satisfies the condition of the foregoing expression (8).

As is seen from the foregoing description, the present invention offers the following advantages.

In characterizing an audio transmitting system by determining tap coefficients of an adaptive filter according to the LMS algorithm, a white noise signal having an average power of one is used as an input signal into the adaptive filter. Accordingly, the step size parameter $\mu_1$ of the LMS algorithm required for stably operating the adaptive filter can be set in a given fixed range. This reduces the complexity of the overall system, which would otherwise be required for setting the step size parameter $\mu_1$.

Further, in setting the characteristics of an audio filter by determining the tap coefficients of an adaptive filter according to the filtered-x LMS algorithm, a white noise signal is used as an input signal into the adaptive filter. Consequently, the step size parameter $\mu_2$ of the filtered-x LMS algorithm required for stably operating the adaptive filter can be set in a given fixed range. This reduces the complexity of the overall system, which would otherwise be required for setting the step size parameter $\mu_2$.

What is claimed is:

1. A method for characterizing an audio transmitting system and setting characteristics of an audio filter, comprising:
   characterizing an audio transmitting system by setting a tap coefficient of a first adaptive filter by using a first predetermined algorithm; and using a first predetermined signal having an average power of one as an input signal into said first adaptive filter; and
   setting characteristics of an audio filter by setting a tap coefficient of a second adaptive filter by using a second predetermined algorithm and a digital filter in which is set said tap coefficient of said first adaptive filter; and using a second predetermined signal having an average power of one as an input signal into said second adaptive filter.

2. A method according to claim 1, wherein one of said predetermined signals comprises a white noise signal.

3. A method according to claim 1, wherein said first predetermined algorithm comprises a least mean squares algorithm.

4. A method according to claim 1, wherein a step size parameter $\mu_1$ of said first predetermined algorithm is set in a range represented by the expression: $0<\mu_1<(2/L)$, where the number of taps of said first adaptive filter is indicated by L.

5. A method according to claim 4, wherein said first predetermined algorithm comprises a least mean squares algorithm.

6. A method according to claim 1, wherein both of said predetermined signals comprise a white noise signal.

7. A method according to claim 1, wherein said second predetermined algorithm comprises a filtered-x least mean squares algorithm.

8. A method according to claim 1, wherein a step size parameter $\mu_2$ of said second predetermined algorithm is set in a range represented by the expression: $0<\mu_2<(2/(LC^t C))$, where the number of taps of said second adaptive filter is indicated by L, a characteristic vector representing an impulse response of the acoustic space used in said second predetermined algorithm is designated by C, and a transposed vector of the characteristic vector C is indicated by $C^t$.

9. A method according to claim 1, wherein said second predetermined algorithm comprises a filtered-x least means squares algorithm.

10. An apparatus for characterizing an audio transmitting system and setting characteristics of an audio filter, comprising:
   a first apparatus for characterizing an audio transmitting system, including:
     a signal generating unit which generates a first predetermined signal having an average power of one;
     a speaker which radiates said first predetermined signal into an acoustic space;
     a microphone placed at a predetermined position in the acoustic space so as to collect sound radiated from said speaker;
   a first adaptive filter which receives said predetermined signal;
     a computation unit which calculates the difference between an output signal of said microphone and an ouput signal of said adaptive filter and outputs the difference as an error signal; and
     a first algorithm-processing unit which receives said first predetermined signal and said error signal and sets a tap coefficient of said first adaptive filter by using a first predetermined algorithm,
   whereby said first apparatus determine characteristics of the audio transmitting system according to characteristics of said first adaptive filter; and
   a second apparatus for setting characteristics of an audio filter by setting a tap coefficient of a second adaptive filter by using a second predetermined algorithm and a digital filter in which is set said tap coefficient of said first adaptive filter; and using a second predetermined signal having an average power of one as an input signal into said second adaptive filter.

11. An apparatus according to claim 10, wherein said first predetermined signal comprises a white noise signal.

12. An apparatus according to claim 10, wherein said first predetermined algorithm comprises a least mean squares algorithm.

13. An apparatus according to claim 10, wherein a step size parameter $\mu_1$ of said first predetermined algorithm is set in a range represented by the expression: $0<\mu_1<(2/L)$, where the number of taps of said first adaptive filter is indicated by L.

14. An apparatus according to claim 13, wherein said first predetermined algorithm comprises a least mean squares algorithm.

15. A vehicle-loaded audio system comprising an apparatus for characterizing an audio transmitting system, said apparatus comprising: a signal generating unit which generates a predetermined signal having an average power of one; a speaker which radiates said predetermined signal into an audio acoustic space; a microphone placed at a predetermined position in the audio acoustic space so as to collect sound radiated from said speaker; an adaptive filter which receives said predetermined signal; a computation unit that calculates the difference between an output signal of said microphone and an output signal of said adaptive filter and that outputs the difference as an error signal; and a first algorithm-processing unit that receives said predetermined signal and said error signal and sets a tap coefficient of said adaptive filter by using a predetermined algorithm, whereby said apparatus determines characteristics of the audio transmitting system according to characteristics of said adaptive filter.

16. An apparatus for characterizing an audio transmitting system and setting characteristics of an audio filter, comprising:

a first apparatus for characterizing an audio transmitting system by setting a tap coefficient of a first adaptive filter by using a first predetermined algorithm; and using a first predetermined signal having an average power of one as an input signal into said first adaptive filter; and a second apparatus for setting characteristics of an audio filter, including:
a signal generating unit which generates a second predetermined signal having an average power of one;
a second adaptive filter that receives said second predetermined signal;
a speaker that radiates an output signal of said second adaptive filter into an acoustic space;
a microphone placed at a predetermined position in the acoustic space so as to collect sound radiated from said speaker;
a target-response setting unit in which predetermined target response characteristics are set so as to output a target response signal corresponding to said second predetermined signal to be input into said target-response setting unit;
a computation unit which calculates the difference between an output signal of said microphone and the target response signal output from said target-response setting unit and which outputs the difference as an error signal; and
a second algorithm-processing unit which receives said second predetermined signal and said error signal and sets a tap coefficient of said second adaptive filter by using a second predetermined algorithm and a digital filter in which is set said tap coefficient of said first adaptive filter,
whereby said second apparatus sets characteristics of the audio filter according to characteristics of said second adaptive filter.

17. An apparatus according to claim 16, wherein said second predetermined signal comprises a white noise signal.

18. An apparatus according to claim 16, wherein said second predetermined algorithm comprises a filtered-x least mean squares algorithm.

19. An apparatus according to claim 16, wherein a step size parameter $\mu_2$ of said second predetermined algorithm is set in a range represented by the expression: $0<\mu_2<(2/(LC^t C))$, where the number of taps of said second adaptive filter is indicated by L, a characteristic vector representing an impulse response of the acoustic space used in said second predetermined algorithm is designated by C, and a transposed vector of the characteristic vector C is indicated by $C^t$.

20. An apparatus according to claim 19, wherein said second predetermined algorithm comprises a filtered-x least means squares algorithm.

21. A vehicle-loaded audio system comprising an apparatus for setting characteristics of an audio filter, said apparatus comprising: a signal generating unit which generates a predetermined signal having an average power of one; an adaptive filter which receives said predetermined signal; a speaker which radiates an output signal of said adaptive filter into an acoustic space; a microphone placed at a predetermined position in the acoustic space so as to collect sound radiated from said speaker; a target-response setting unit in which predetermined target response characteristics are set so as to output a target response signal corresponding to said predetermined signal to be input into said target-response setting unit; a computation unit which calculates the difference between an output signal of said microphone and the target response signal output from said target-response setting unit and outputs the difference as an error signal; and a second algorithm-processing unit which receives said predetermined signal and said error signal and sets a tap coefficient of said adaptive filter by using a predetermined algorithm, whereby said apparatus sets characteristics of the audio filter according to characteristics of said adaptive filter.

* * * * *